(12) United States Patent
Won et al.

(10) Patent No.: US 11,109,129 B2
(45) Date of Patent: Aug. 31, 2021

(54) DISPLAY DEVICE

(71) Applicant: Samsung Display Co., Ltd., Yongin-si (KR)

(72) Inventors: Byeong Hee Won, Yongin-si (KR); Yi Joon Ahn, Yongin-si (KR); Jung Hun Noh, Yongin-si (KR); Ji Yeon Seo, Yongin-si (KR); Joon Hak Oh, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/549,030

(22) Filed: Aug. 23, 2019

(65) Prior Publication Data

US 2020/0137472 A1 Apr. 30, 2020

(30) Foreign Application Priority Data

Oct. 25, 2018 (KR) ........................ 10-2018-0128405

(51) Int. Cl.
*H04R 1/02* (2006.01)
*H01L 27/32* (2006.01)
*H04R 1/40* (2006.01)
*H04R 3/12* (2006.01)

(52) U.S. Cl.
CPC ......... *H04R 1/028* (2013.01); *H01L 27/3225* (2013.01); *H04R 1/403* (2013.01); *H04R 3/12* (2013.01); *H04R 2499/15* (2013.01)

(58) Field of Classification Search
None
See application file for complete search history.

(56) References Cited

U.S. PATENT DOCUMENTS

| | | | |
|---|---|---|---|
| 2010/0084661 A1 | 4/2010 | Hwang | |
| 2014/0013850 A1 | 1/2014 | Kim et al. | |
| 2015/0326936 A1 | 11/2015 | Bak | |
| 2019/0037164 A1* | 1/2019 | Kim | H04R 1/2873 |
| 2019/0205603 A1* | 7/2019 | Lee | G06K 9/0002 |

FOREIGN PATENT DOCUMENTS

| | | |
|---|---|---|
| EP | 3343272 | 7/2018 |
| JP | 2011-138020 | 7/2001 |
| JP | 2009-100223 | 5/2009 |
| KR | 10-0924499 | 11/2009 |
| KR | 10-2014-0009673 | 1/2014 |
| KR | 10-1534428 | 7/2015 |
| KR | 10-2015-0129557 | 11/2015 |
| KR | 10-1769865 | 8/2017 |
| WO | 2012/129247 | 9/2012 |

OTHER PUBLICATIONS

European Search Report dated Mar. 27, 2020 to the European Patent Application No. 19205299.1.

* cited by examiner

*Primary Examiner* — Kenny H Truong
(74) *Attorney, Agent, or Firm* — H.C. Park & Associates, PLC

(57) ABSTRACT

A display device including: a display panel having a substrate including a plurality of islands and a plurality of bridges coupling the islands to each other; and a plurality of actuators provided on first surfaces of at least one or more of the islands of the substrate. The actuators may vibrate a first area of the display panel that includes portions overlapping with the respective actuators.

13 Claims, 16 Drawing Sheets

FIG. 2A
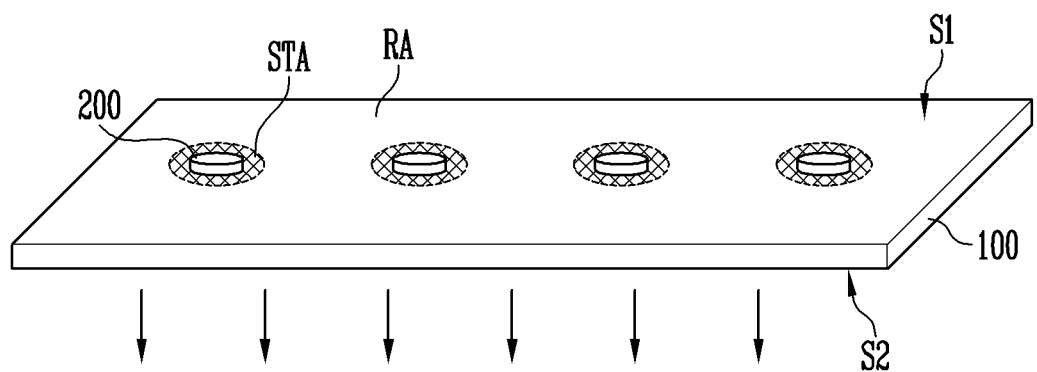
FIG. 2B
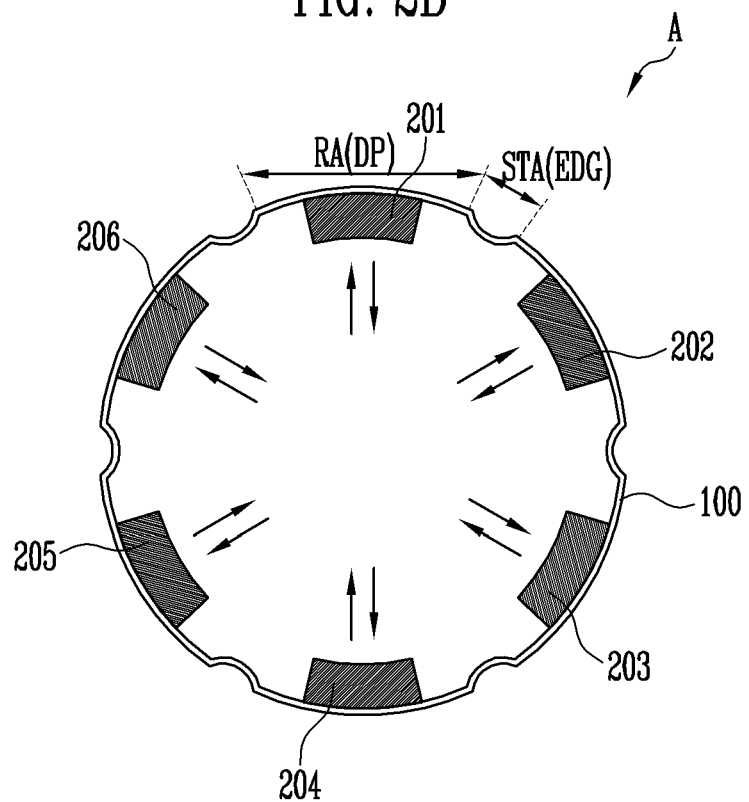

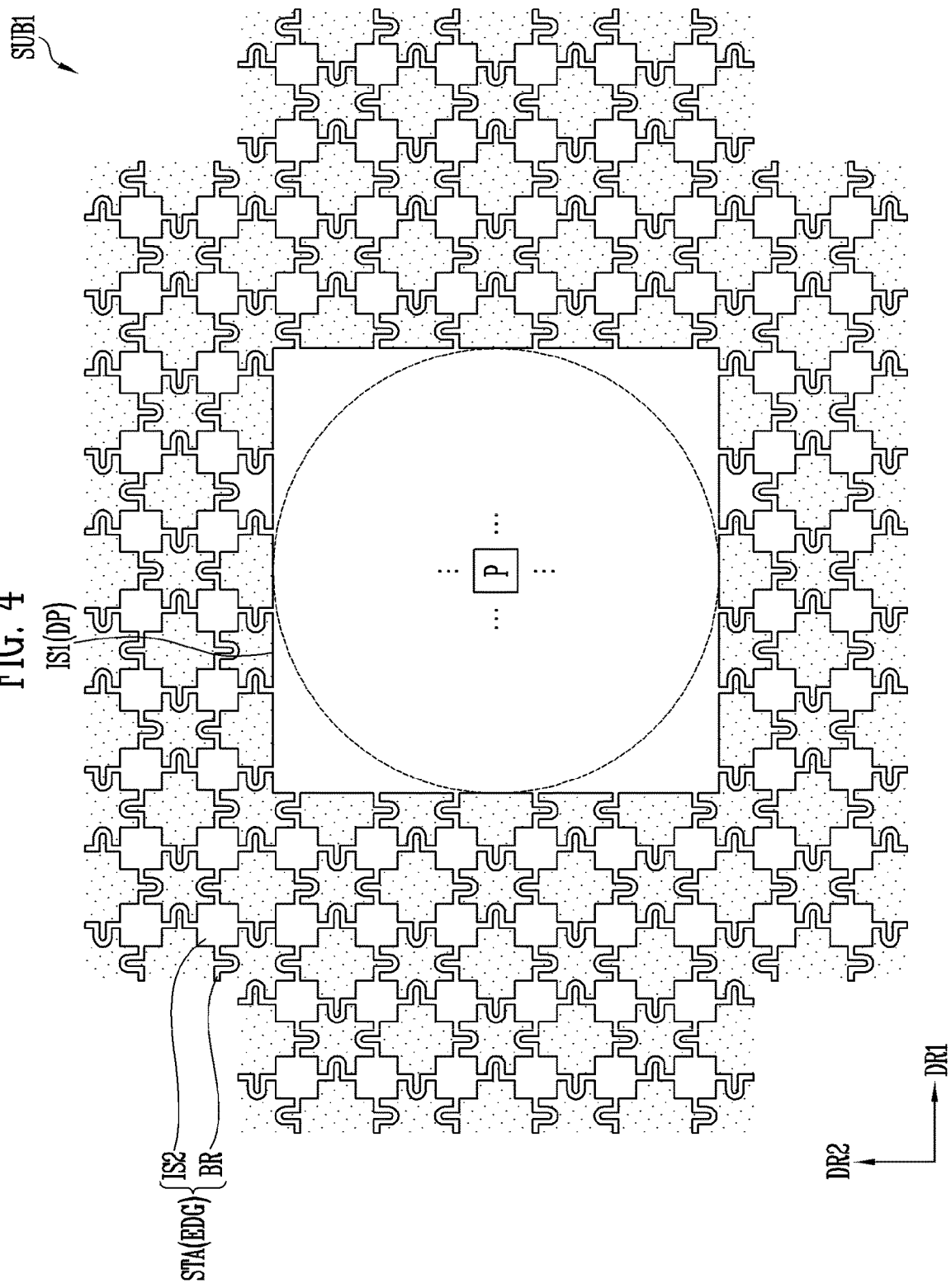

DISPLAY DEVICE

CROSS REFERENCE TO RELATED APPLICATIONS

This application claims priority from and the benefit of Korean Patent Application No. 10-2018-0128405, filed on Oct. 25, 2018, which is hereby incorporated by reference for all purposes as if fully set forth herein.

BACKGROUND

Field

Exemplary embodiments/implementations of the invention relate generally to an electronic device and, more specifically, to a display device.

Discussion of the Background

Representative examples of display devices include a liquid crystal display (LCD), a plasma display panel (PDP), an organic light emitting diode (OLED) device, a field effect display (FED), and an electrophoretic display device.

The OLED device has self-luminance characteristics and does not need a separate light source unlike that of the LCD, so that the thickness and weight thereof can be reduced compared to that of the LCD. Furthermore, such an OLED device is attractive as a next-generation display device because it has desirable characteristics of low power consumption, high brightness, and high response speed.

Recently, display devices that are flexible, foldable or extendable have been developed. In addition, electronic devices for transmitting image information and sound information in all directions of 360° around display devices are being developed.

The above information disclosed in this Background section is only for understanding of the background of the inventive concepts, and, therefore, it may contain information that does not constitute prior art.

SUMMARY

Various exemplary embodiments of the inventive concepts are directed to a display device in which portion of a display panel functions as a diaphragm of a speaker so that both sound and an image may be output from the display panel.

However, objects of the inventive concepts are not limited to the above-described objects, and various modifications are possible without departing from the scope of the inventive concepts.

Additional features of the inventive concepts will be set forth in the description which follows, and in part will be apparent from the description, or may be learned by practice of the inventive concepts.

An exemplary embodiment of the inventive concepts may provide a display device including: a display panel comprising a substrate including a plurality of islands and a plurality of bridges coupling the islands to each other; and a plurality of actuators provided on first surfaces of at least one or more of the islands of the substrate. The actuators may vibrate a first area of the display panel that includes portions overlapping with the respective actuators.

In an exemplary embodiment, an outer surface of the display panel may include an emission surface, and an inner surface of the display panel may define an empty space.

In an exemplary embodiment, an image and sound may be output outward from the display panel that overlaps with the actuators.

In an exemplary embodiment, the display panel may further include: a plurality of pixels provided on a second surface of each of the islands that is opposite to the first surface; and lines provided on the plurality of respective bridges and coupled with the respective pixels.

In an exemplary embodiment, the display device may further include a plurality of reinforcing members provided to overlap with the respective actuators, and disposed between the respective actuators and the corresponding islands.

In an exemplary embodiment, the reinforcing members may include at least one of metal and glass.

In an exemplary embodiment, the display device may further include a support member disposed on a surface of each of the actuators that is opposite to a surface of the actuator that comes into contact with the corresponding island, the support member being configured to support the corresponding actuator.

In an exemplary embodiment, the actuators may be disposed in one-to-one correspondence with the first surfaces of the respective islands.

In an exemplary embodiment, the bridges may stretch such that the first area of the display panel vibrates only in a vertical direction with respect to the actuators, and function as a speaker edge.

In an exemplary embodiment, the islands may include: a plurality of first islands on which the respective actuators are disposed; and a plurality of second islands disposed between the first islands and provided with no actuator.

In an exemplary embodiment, the second islands and the bridges may form a stretchable area.

In an exemplary embodiment, an area of each of the first islands may be greater than an area of each of the second islands.

In an exemplary embodiment, the display device may further include a plurality of reinforcing members provided to overlap with the respective actuators, and disposed between the respective actuators and the corresponding first islands.

An exemplary embodiment of the inventive concepts may provide a display device including: a display panel having an outer surface formed to emit light, and an inner surface formed to define an empty space, the display panel including a diaphragm area and a speaker edge area; and a plurality of actuators provided on the inner surface of the display panel. The display panel may include a substrate provided to form the inner surface. Each of the actuators may overlap with the diaphragm area and be disposed on a first surface of the substrate.

In an exemplary embodiment, the substrate may include: a plurality of first islands on which the respective actuators are disposed; a plurality of second islands disposed between the first islands and provided with no actuator; and a plurality of bridges configured to couple the first and/or second islands that are adjacent to each other.

In an exemplary embodiment, the first islands may correspond to the diaphragm area.

In an exemplary embodiment, the bridges that are coupled to the first islands may correspond to the speaker edge area.

In an exemplary embodiment, the second islands and the bridges may correspond to the speaker edge area.

In an exemplary embodiment, the display panel may include: a plurality of pixels provided on a second surface of each of the first and second islands that is opposite to the first surface; and lines provided on the plurality of respective bridges and coupled with the respective pixels.

In an exemplary embodiment, the display device may further include: a plurality of reinforcing members provided to overlap with the respective actuators, and disposed between the respective actuators and the corresponding first islands; and a support member disposed on a surface of each of the actuators that is opposite to a surface of the actuator that comes into contact with the corresponding island, the support member being configured to support the corresponding actuator.

In an exemplary embodiment, an image and sound may be output from the outer surface of the display panel that overlaps with the actuators.

In an exemplary embodiment, the display device may further include: a sensor configured to sense a location of an object; and a sound controller configured to differently control intensities of sound output from a plurality of diaphragm areas, based on the location of the object.

In an exemplary embodiment, the sound controller may supply a sound signal having an identical intensity to a pair of actuators that are disposed farthest from each other in a plan view.

In an exemplary embodiment, a phase of a sound signal to be provided to a first pair of actuators that are closest to the location of the object may be opposite to a phase of a sound signal to be provided to remaining pairs of actuators. An intensity of the sound signal to be provided to the first pair of actuators may be greater than an intensity of the sound signal to be provided to the remaining pairs of actuators.

In an exemplary embodiment, when the sound is output, a curvature of diaphragm areas that correspond to the first pair of actuators may be increased, and an intensity of sound corresponding to the first pair of actuators may be greater than an intensity of sound corresponding to the remaining pairs of actuators.

In an exemplary embodiment, when the sound is output, a stretch range of a first speaker edge area that corresponds to the first pair of actuators may be greater than stretch ranges of remaining speaker edge areas that correspond to the remaining pairs of actuators.

In a display device in accordance with various exemplary embodiments of the inventive concepts, a display area of a display panel may not only display an image but also function as a speaker. Furthermore, since the display device includes a rigid diaphragm area and a stretchable speaker edge area that encloses the diaphragm area, the sound output quality of the display panel itself may be markedly improved.

In addition, the sound output holes that have been formed in the conventional display panel may be removed. Therefore, the cost required to couple a separate speaker component to the display device may be reduced. Since the sound output holes are removed from the display area, the display quality may also be enhanced, and the aesthetic effect of the display device may be improved.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 2A is a diagram illustrating an example of an unfolded state of the display device of FIG. 1.

FIG. 2B is a diagram schematically illustrating an example of a horizontal cross-section of area A of the display device of FIG. 1.

FIG. 4 is a diagram schematically illustrating an example of portion of the display device of FIG. 1.

DETAILED DESCRIPTION

Figure 1:
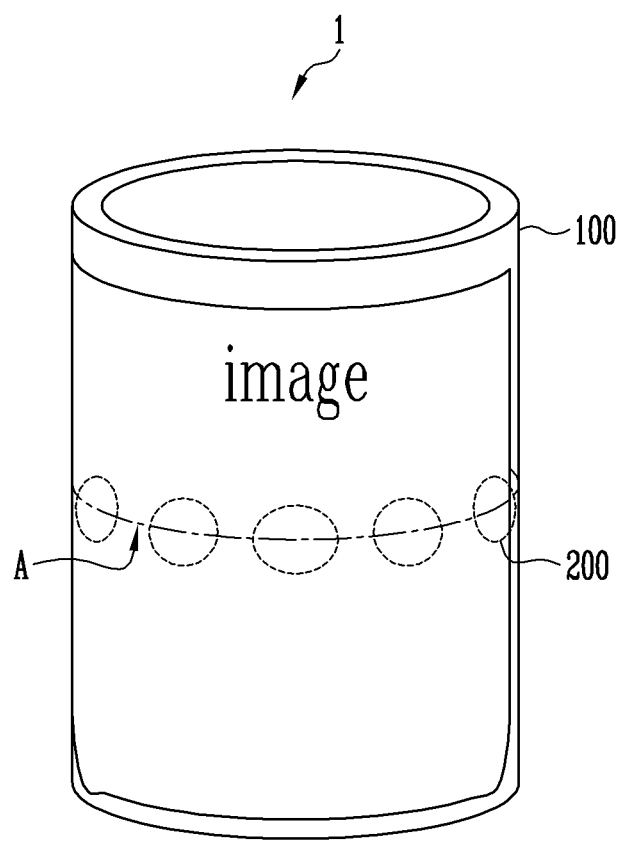
FIG. 1 is a diagram illustrating a display device in accordance with exemplary embodiments of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a diagram illustrating a display device 1 in accordance with exemplary embodiments of the inventive concepts. FIG. 2A is a diagram illustrating an example of an unfolded state of the display device 1 of FIG. 1. FIG. 2B is a diagram schematically illustrating an example of a horizontal cross-section of area A of the display device 1 of FIG. 1.

Referring to FIGS. 1 to 2B, the display device 1 may include a display panel 100 and a plurality of actuators 200.

The display panel 100 may include flexible or bendable material. In an exemplary embodiment, the display panel 100 may be an organic light emitting display panel.

In an exemplary embodiment, an outer surface (designated by S2 in FIG. 2A) of the display panel 100 may be an emission surface. In other words, pixels included in the display panel 100 may emit light outward. Furthermore, sound may be output from the outer surface S2 of the display panel 100. For example, sound may be output through the outer surface S2 from portions of the display panel 100 that overlap with the actuators 200.

An inner surface (designated by S1 in FIG. 2A) of the display panel 100 may define an empty space. The display panel 100 may have a bent shape. For example, as shown in FIG. 1, the display panel 100 may have a cylindrical shape, and the inner surface of the display panel 100 may define a cylindrical space. Hence, the display panel 100 may be a flexible display panel or a rigid display panel that is manufactured in a cylindrical shape.

However, this is only for illustrative purposes, and the three-dimensional shape of the display panel 100 is not limited thereto. For example, the display panel 100 may have a polyhedral shape such as a cube, a three-dimensional shape including a curved surface and/or a bent part on at least a portion thereof, and so forth. Furthermore, the display panel 100 may have a three-dimensional shape, in which portion of the empty space defined by the inner surface S1 has a curved shape, or which has a plurality of curved surface parts and/or bent parts. Thereby, an image displayed on the display device 1 may be visible in all directions from the outside of the display device 1.

In an exemplary embodiment, the display panel 100 may include a rigid area RA and a stretchable area STA.

The rigid area RA may be an area that is not changed in shape of the display panel 100 by control or an external stimulus. For example, the rigid area RA of the display panel 100 may have a planar shape or a curved shape. A curved part may be curved at an acute or obtuse angle with respect to an imaginary reference surface.

In an exemplary embodiment, as shown in FIG. 2B, the rigid area RA may vertically vibrate, by the operation of the actuators 200 overlapping with the rigid area RA, in a normal direction with respect to the surface of the rigid area RA to which the actuators 200 are attached. Here, despite the vertical vibration, the shape of the rigid area RA of the display panel 100 may be maintained.

The stretchable area STA may correspond to an area of the display panel 100 that stretches or shrinks by control or an external stimulus. The stretchable area STA may stretch or shrink in one direction. The stretchable area STA may be formed to enclose an area in which the actuator 200 is disposed.

In an exemplary embodiment, the stretchable area STA may not include pixels and may include only a substrate and some lines of the display panel 100. In an exemplary embodiment, the stretchable area STA may include the lines and some pixels coupled to the lines.

The stretchable area STA may stretch by vibration of the rigid area RA that is enclosed by the stretchable area STA. The stretchable area STA may function to control the direction of the vibration of the rigid area RA. In other words, the stretchable area STA may function as a speaker edge. Due to the stretching of the stretchable area STA, the vibration of the rigid area RA may be focused on only the vertical direction, and the rigid area RA may be effectively prevented from unnecessarily moving in a horizontal direction.

In an exemplary embodiment, the display panel 100 may include a plurality of islands and a plurality of bridges which connect the islands to each other. In an exemplary embodiment, the islands may form the rigid area RA, and the bridges may form the stretchable area STA. In an exemplary embodiment, some islands may form the rigid area RA, and some islands and the bridges may form the stretchable area STA.

In an exemplary embodiment, the display panel 100 may include a scan driver configured to supply scan signals to a plurality of pixels P, a data driver configured to supply data signals to the pixels P, a timing controller configured to control the scan driver and the data driver, and a power supply unit configured to supply a power supply voltage to the pixels P.

The plurality of actuators 200 may be respectively provided on first surfaces of at least one or more of the islands of the substrate. The first surface of the island may correspond to the inner surface S1 of the display panel 100. The actuator 200 may vibrate a first area (corresponding to portion of the rigid area RA) of the display panel 100 that overlaps with the actuator 200. Sound may be generated by vibration of the display panel 100 and output out of the display device 1. Each actuator 200 may constitute one speaker component.

In an exemplary embodiment, the actuator 200 may include a voice coil and a magnet or a piezoelectric element to embody a dynamic speaker. However, this is only exemplary, and the configuration of the actuator 200 is not limited thereto. For example, the actuator 200 may be implemented using various configurations for outputting sound by vibrating the display panel 100.

The actuators 200 may be disposed such that sound may be output in all directions out of the display device 1. Although FIGS. 1 and 2A illustrate that the actuators 200 are arranged along an imaginary line, the arrangement of the actuators 200 is not limited thereto. Thanks to the abovementioned arrangement of the actuators 200, sound may be output in all directions out of the display device 1.

Although FIGS. 1 and 2A illustrate that each actuator 200 has a circular plan shape, the plan shape of the actuator 200 is not limited thereto. For example, the actuator 200 may be formed in an elliptical plan shape, a square plan shape, or a plan shape of a figure formed by a combination of at least one curve and at least one straight line.

Figure 3A:
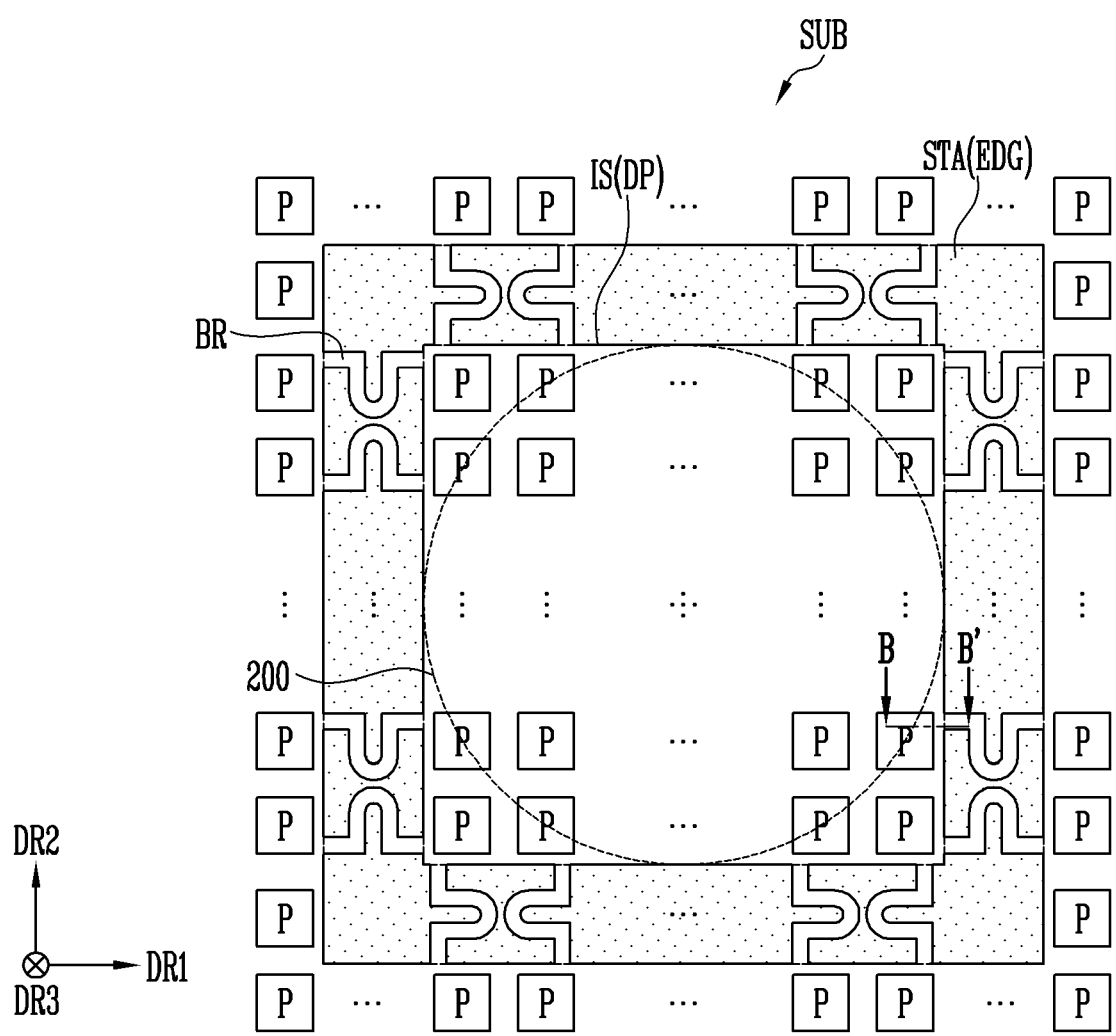
FIG. 3A is a plan view schematically illustrating an example of portion of the display device of FIG. 1.

FIG. 3A is a plan view schematically illustrating an example of portion of the display device 1 of FIG. 1.

Referring to FIGS. 1 to 3A, the substrate SUB may include a plurality of islands IS, and a plurality of bridges BR which connect the islands IS to each other.

The substrate SUB may be a structure for supporting pixels P, etc. and be stretchable so that it may stretch or shrink in a direction.

The substrate SUB may be made of insulating material such as resin. Furthermore, the substrate SUB may have a single- or multi-layer structure.

For example, the substrate SUB may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

As shown in FIG. 3A, a plurality of pixels PX may be disposed in each island IS. Furthermore, an actuator 200 may be disposed to overlap with the island IS. The island IS overlapping with the actuator 200 may correspond to a diaphragm area DP. In other word, the island IS corresponding to the diaphragm area DP may function as a diaphragm of a speaker.

The bridges BR may be disposed to connect the island IS with islands IS adjacent thereto. Lines for connecting the pixels P to each other may be included in the bridges BR. For example, the lines may include a data line, a scan line, a power supply line, etc.

In an exemplary embodiment, as shown in FIG. 3A, each of the bridges BR may be disposed to correspond to a pixel column or a pixel row. However, this is only for illustrative purposes, and the number of bridges BR may differ from the number of pixel columns/rows. For instance, each bridge BR coupled to the corresponding island IS may correspond to a plurality of pixel columns and/or pixel rows.

In an exemplary embodiment, as shown in FIG. 3A, each of the bridges BR may have a sinusoidal shape or a wavy shape. However, the shape of the bridge BR is not limited thereto, and the bridge BR may have a saw shape, a triangle wave shape, a square wave shape, etc. In other words, each of the bridges BR may be formed in a shape facilitating stretching.

When the substrate SUB stretches, the bridges BR also stretch, so that the distance between the islands IS may increase. In this case, the shape of each island IS may not be deformed. In other words, in the substrate SUB and the display panel 100, substantial stretching operation may be performed in only the bridges BR. Hence, an area in which the bridges BR are disposed may correspond to the stretchable area STA.

Since the shape of the island IS is not changed, the structures of the pixels PXL formed on the island IS may also not be deformed. Thus, the sound output reliability and the quality of the island IS functioning as a diaphragm may be enhanced.

The bridges BR may stretch in response to vibration of the island IS of the diaphragm area DP in the vertical direction (corresponding to DR3 of FIG. 3A) by the actuator 200. The bridges BR may control the vibration direction of the diaphragm area DP. In other words, the bridges BR and the stretchable area STA including the bridges BR may correspond to a speaker edge area EDG. Therefore, the vibration of the diaphragm area DP may be focused on only the vertical direction, and horizontal vibration or movement thereof may be restrained.

The stretchable area STA or the speaker edge area EDG may be formed to enclose the diaphragm area DP. In the speaker edge area EDG, the arrangement of the bridges BR may be designed such that the vibration direction of the diaphragm area DP may be as vertical as possible. In other words, the arrangement of the bridges BR and the plan shape of each bridge BR may be determined such that forces generated in directions other than the vertical direction may be offset by the stretching of the bridges BR.

Although FIG. 3A illustrates that the island IS corresponding to the diaphragm area DP is square, the shape of the island IS is not limited thereto. In an exemplary embodiment, the island IS may have substantially the same shape as the plan shape of the actuator 200. For example, the plan shape of the island IS corresponding to the diaphragm area DP may be a circular or elliptical shape corresponding to that of the actuator 200.

In an exemplary embodiment, the actuator 200 may not be disposed in an island adjacent to the island IS that corresponds to the diaphragm area DP. For example, the islands may include first islands IS in which respective actuators are disposed, and second islands which are provided with no actuator and disposed between the first islands IS.

Each second island may be coupled to the corresponding first islands IS by the bridges BR. At least one pixel P may be disposed on the second island. An area corresponding to the second island may display an image. In an exemplary embodiment, each pixel P may have a plurality of sub-pixels which respectively output a plurality of color lights. Each of the sub-pixels may output one of red light, green light, blue light, and white light. The shapes, the sizes, etc. of the first island IS and the second island may be equal to or different from each other.

As such, the display device 1 in accordance with exemplary embodiments of the inventive concepts may not only display an image but also output sound because some areas of the display panel 100 may function as diaphragms. Furthermore, in the display device 1, the speaker edge area EDG enclosing the rigid diaphragm area DP may be formed of the stretchable area STA to enhance the reliability of the output of sound. Therefore, the display area of the display panel 100 may function as a speaker as well as displaying an image. Sound output holes that have been formed in the display panel in the conventional art may be removed.

Thereby, the production cost of a speaker and the cost required to couple the speaker to the display device may be reduced. In addition, since the sound output holes are removed, the image display quality may be enhanced, and the aesthetic effect of the display device 1 may be improved.

Figure 3B:
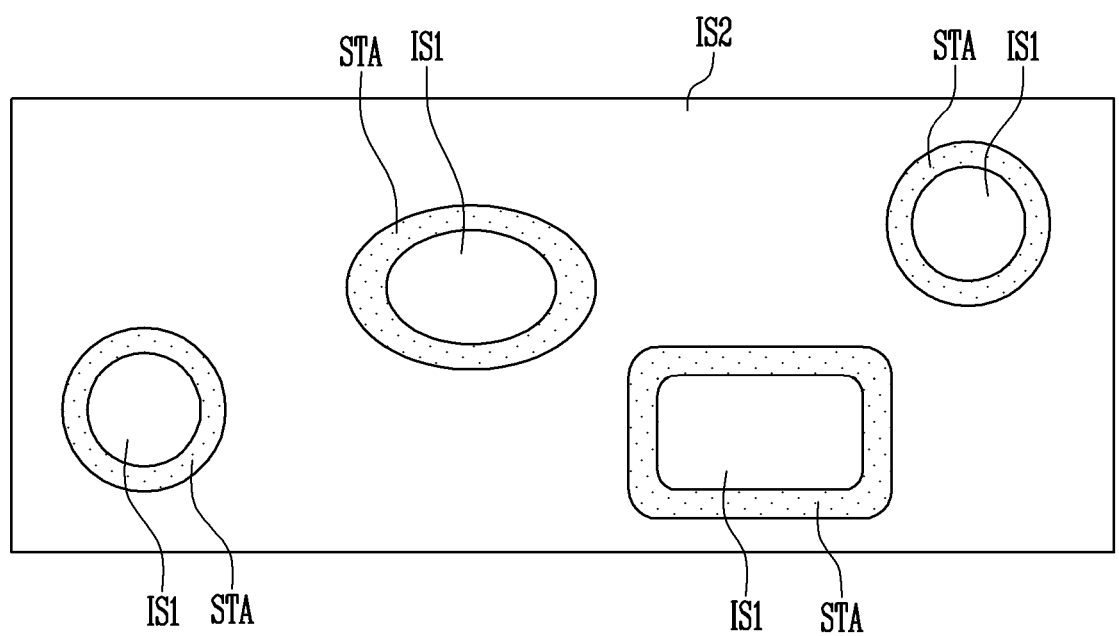
FIG. 3B is a plan view schematically illustrating an example of portion of a substrate of FIG. 3A.

FIG. 3B is a plan view schematically illustrating an example of portion of the substrate SUB of FIG. 3A.

Referring to FIGS. 3A and 3B, the substrate SUB may include a plurality of first islands IS1 and a second island IS2.

An actuator may be disposed in each of the first islands IS1, and each first island IS1 may correspond to the diaphragm area DP. The first island IS1 may have various plan shapes and various sizes depending on the shape of the actuator. Hence, sound of various registers may be output using respective diaphragm areas DP. For example, each of the diaphragm areas DP may be used to embody any one of a subwoofer, a woofer, a squawker, and a tweeter.

No actuator is disposed in the second island IS2. The second island IS2 may correspond to a display area for displaying an image.

In an exemplary embodiment, a plurality of bridges (BR of FIG. 3A) may be disposed in each stretchable area STA that encloses the corresponding first island IS1. The bridges BR may couple the first island IS1 with the second island IS2. The stretchable area STA may correspond to a speaker edge area EDG.

In an exemplary embodiment, the stretchable area STA may include a plurality of bridges BR, and a plurality of fine islands coupled to the bridges BR.

FIG. 4 is a plan view schematically illustrating an example of portion of the display device 1 of FIG. 1.

In FIG. 4, like reference numerals will be used to designate the same components as those described with reference to FIG. 3A, and repetitive explanation of the components will be omitted. Furthermore, a substrate SUB1 of FIG. 4, other than the configuration of the speaker edge area EDG, my have a configuration identical or similar to that of the substrate SUB and display device of FIG. 3A.

Referring to FIG. 4, islands included in the substrate SUB1 may include first islands IS1 and second islands IS2.

An actuator may be disposed in each of the first islands IS1, and each first island IS1 may correspond to the diaphragm area DP. No actuator is disposed in the second island IS2.

Each of the bridges BR may couple a first island IS1 and a second island IS2 that are adjacent to each other, or couple adjacent second islands IS2.

In an exemplary embodiment, the area of the first island IS1 may be greater than that of the second island IS2. In other words, the number of pixels P included in the first island IS1 may be different from the number of pixels P included in the second island IS2. For example, a plurality of pixels P may be included in the first island IS1, and one pixel P may be included in the second island IS2. Each of the pixels P may include a plurality of sub-pixels (emission areas).

The first island IS1 may correspond to a diaphragm area DP.

In an exemplary embodiment, the second island IS2 and the bridges BR may form a stretchable area STA. Substantially, the second islands IS2 do not stretch, and only bridges BR may stretch. However, since the area of each second island IS2 is significantly smaller than that of each first island IS1, the second islands IS2 and the bridges BR may be regarded as the stretchable area STA. The stretchable area STA may correspond to a speaker edge area EDG.

As such, since the speaker edge area EDG is formed of the plurality of fine islands (i.e., the second islands IS2) and the bridges BR, the implementation of the speaker edge area EDG may be facilitated. Therefore, the quality of sound output from the diaphragm area DP of the display panel 100 may be enhanced.

Figure 5:
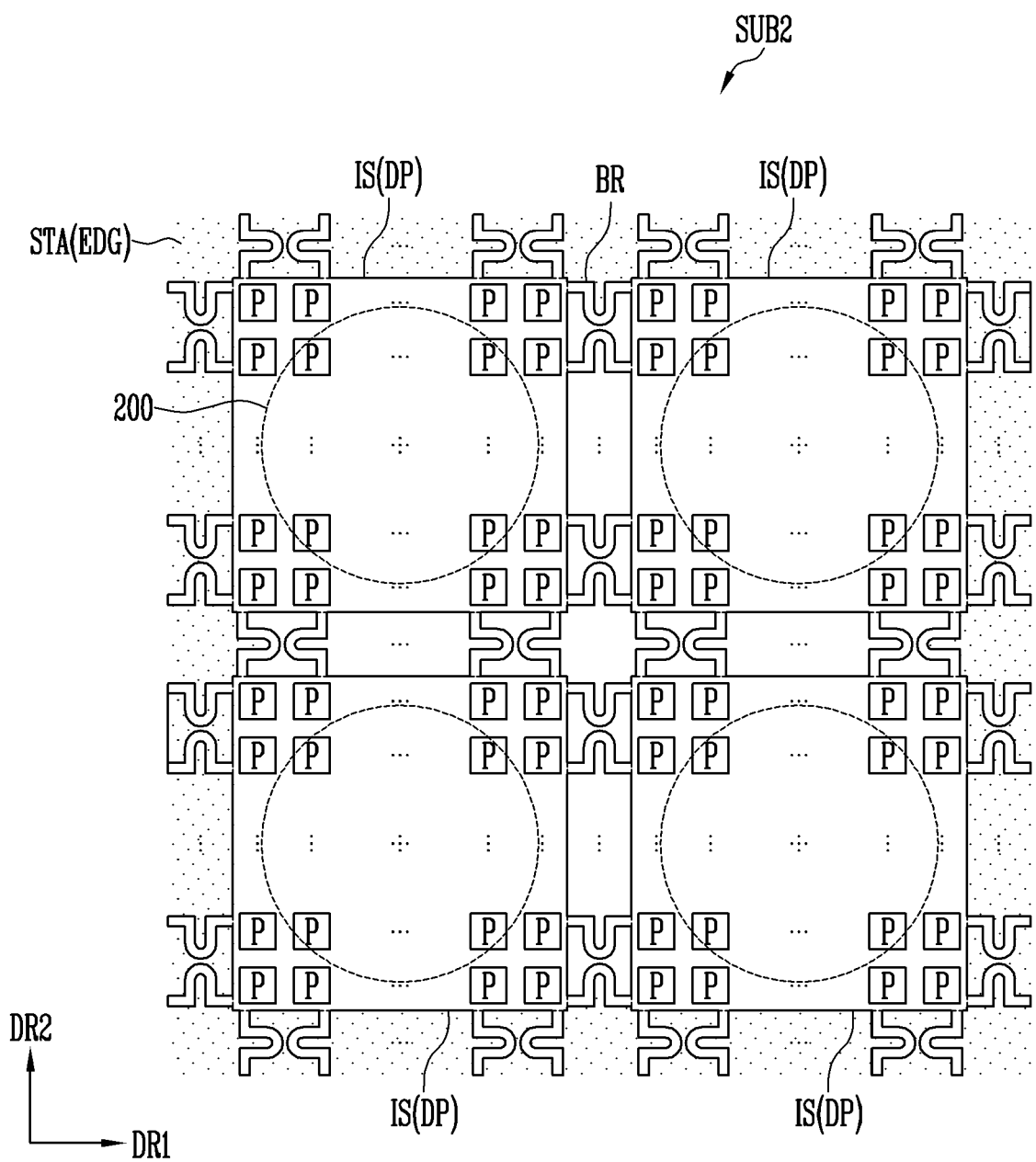
FIG. 5 is a diagram schematically illustrating an example of portion of the display device of FIG. 1.

FIG. 5 is a plan view schematically illustrating an example of portion of the display device 1 of FIG. 1.

In FIG. 5, like reference numerals will be used to designate the same components as those described with reference to FIG. 3A, and repetitive explanation of the components will be omitted. Furthermore, a substrate SUB2 of FIG. 5, other than the configuration of the diaphragm area DP and the speaker edge area EDG, my have a configuration identical or similar to that of the substrate SUB and the display device of FIG. 3A.

Referring to FIG. 5, a plurality of islands IS corresponding to the diaphragm area DP may be arranged in an array form.

In an exemplary embodiment, a plurality of bridges BR may be disposed in the speaker edge area EDG. The speaker edge area EDG may correspond to a stretchable area STA. Diaphragm areas DP that are adjacent to each other may share the speaker edge area EDG. Therefore, a speaker of the display device may be implemented by an array of a plurality of actuators 200 and islands IS corresponding to the respective actuators 200.

Figure 6:
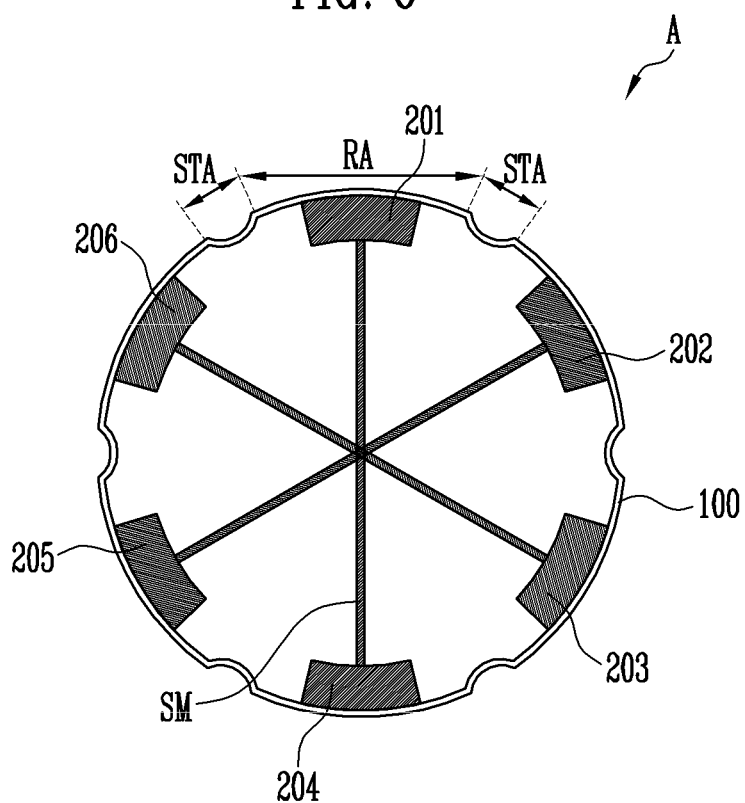
FIG. 6 is a diagram schematically illustrating an example of a horizontal cross-section of area A of the display device of FIG. 1.
Figure 7A:
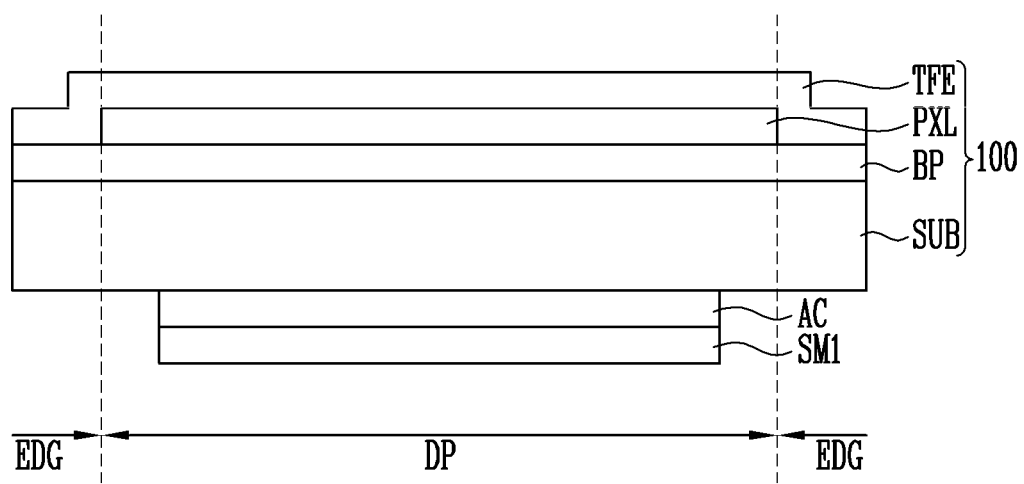
FIGS. 7A and 7B are sectional views schematically illustrating examples of portion of the display device of FIG. 1.
Figure 7B:
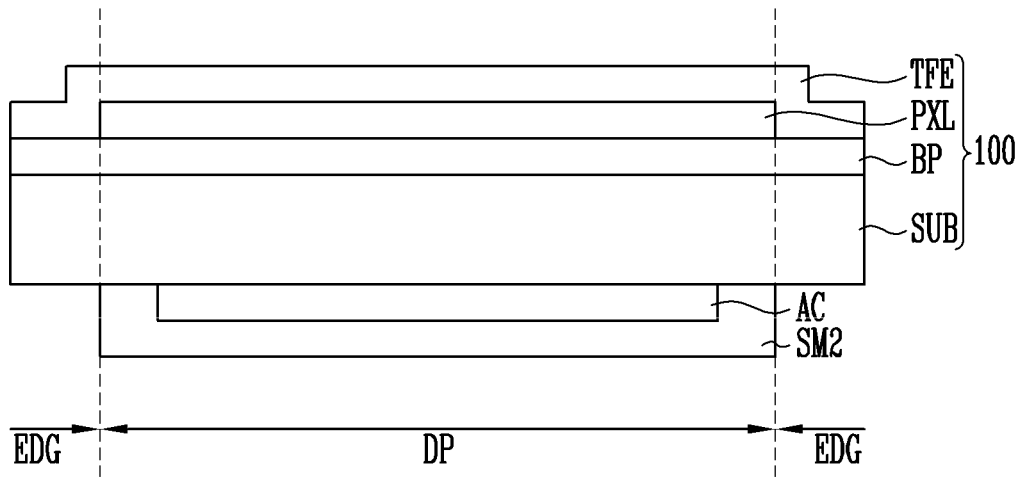

FIG. 6 is a diagram schematically illustrating an example of a horizontal cross-section of area A of the display device 1 of FIG. 1. FIGS. 7A and 7B are sectional views schematically illustrating examples of portion of the display device 1 of FIG. 1.

In FIGS. 6 to 7B, like reference numerals will be used to designate the same components as those described with reference to FIGS. 2B to 5, and repetitive explanation of the components will be omitted. Furthermore, the display device 1 of FIG. 6, other than the configuration of a support member SM, may have a configuration identical or similar to that of the display device 1 of FIG. 2B.

Referring to FIGS. 1, 2A, 2B, 6, 7A, and 7B, the display device 1 may include a display panel 100, a plurality of actuators 201 to 206, and support members SM.

The display panel 100 may include a plurality of rigid areas RA, and a plurality of stretchable areas STA. In an exemplary embodiment, some rigid areas RA may correspond to a display area, and some rigid areas RA may correspond to both the display area and diaphragm areas.

The stretchable areas STA may be formed to enclose the respective diaphragm areas and control vibration directions of the diaphragm areas. Each stretchable area STA may include a plurality of bridges, or a plurality of bridges and a plurality of fine islands coupled with the bridges.

The support members SM may be disposed on surfaces of the actuators 201 to 206 that are opposite to surfaces thereof coming into contact with the islands, and may support the respective actuators 201 to 206. The support members SM may be fixed to a frame or the like that is provided in the display device, and may restrain movement of the actuators 201 to 206 and provide repulsive force for reinforcing the vertical vibration of the display panel 100.

In an exemplary embodiment, each support member SM may be integrally coupled to corresponding actuators that face each other. In an exemplary embodiment, as illustrated in FIG. 7B, each of the actuators 201 to 206 may be recessed into the corresponding support member SM.

As illustrated in FIGS. 7A and 7B, the display panel 100 may include a substrate SUB, a backplane structure BP, a pixel structure PXL, and a thin-film encapsulation layer TFE. An actuator AC may be provided on a first surface of the substrate SUB. For example, one surface of the actuator AC may be attached to the substrate SUB by an adhesive. The actuator AC may include various configurations for outputting sound by vibrating the display panel 100.

The actuator AC may be formed to overlap with a diaphragm area DP.

A support member SM1 or SM2 may be disposed on the other surface of the actuator AC that is opposite to the one surface. The support member SM1 or SM2 may include insulating material such as plastic. In an exemplary embodiment, as illustrated in FIG. 7B, the actuator AC may be recessed in the support member SM2 and fixed to the first surface of the substrate SUB.

The substrate SUB may include an island corresponding to a diaphragm area DP, and a bridge corresponding to a speaker edge area EDG. In an exemplary embodiment, the speaker edge area EDG may include a stretchable substrate configuration including a plurality of bridges and a plurality of fine islands.

The backplane structure BP may be disposed on a second surface of the substrate SUB that is opposite to the first surface. At least one insulating layer and a circuit element may be included in the backplane structure BP. The circuit element may include a transistor, a signal line, a capacitor, etc.

The pixel structure PXL may be disposed on the backplane structure BP. A light emitting element such as an organic light emitting diode may be formed in the pixel structure PXL.

The thin-film encapsulation layer TFE may encapsulate the pixel structure PXL. The thin-film encapsulation layer TFE may include at least one insulating layer.

Figure 8A:
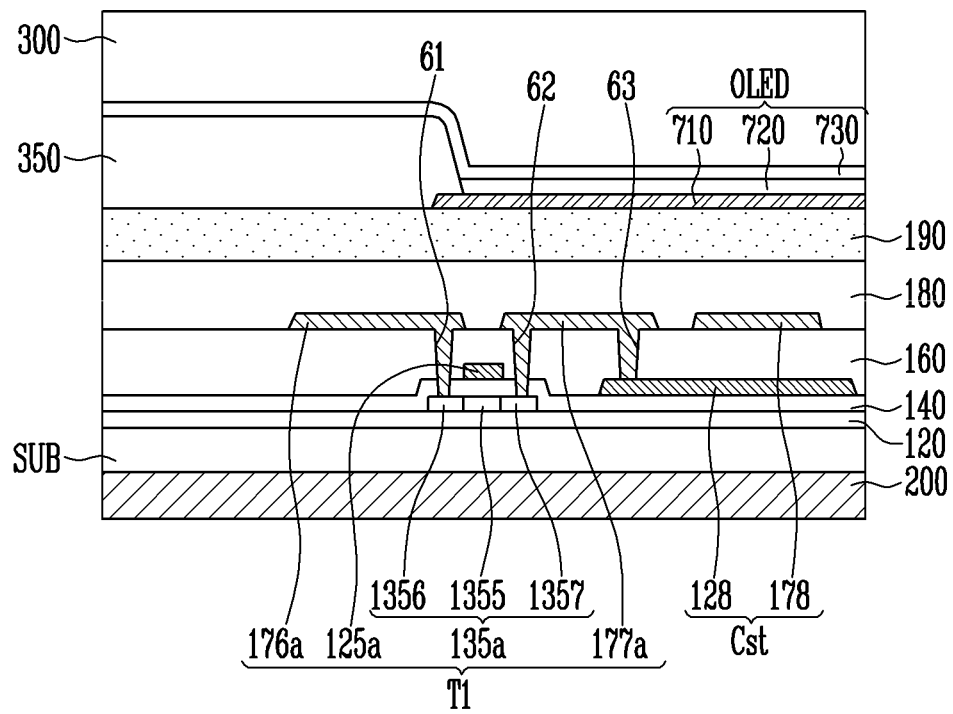
FIGS. 8A and 8B are sectional views illustrating an example of a diaphragm area included in the display device FIG. 1.
Figure 8B:
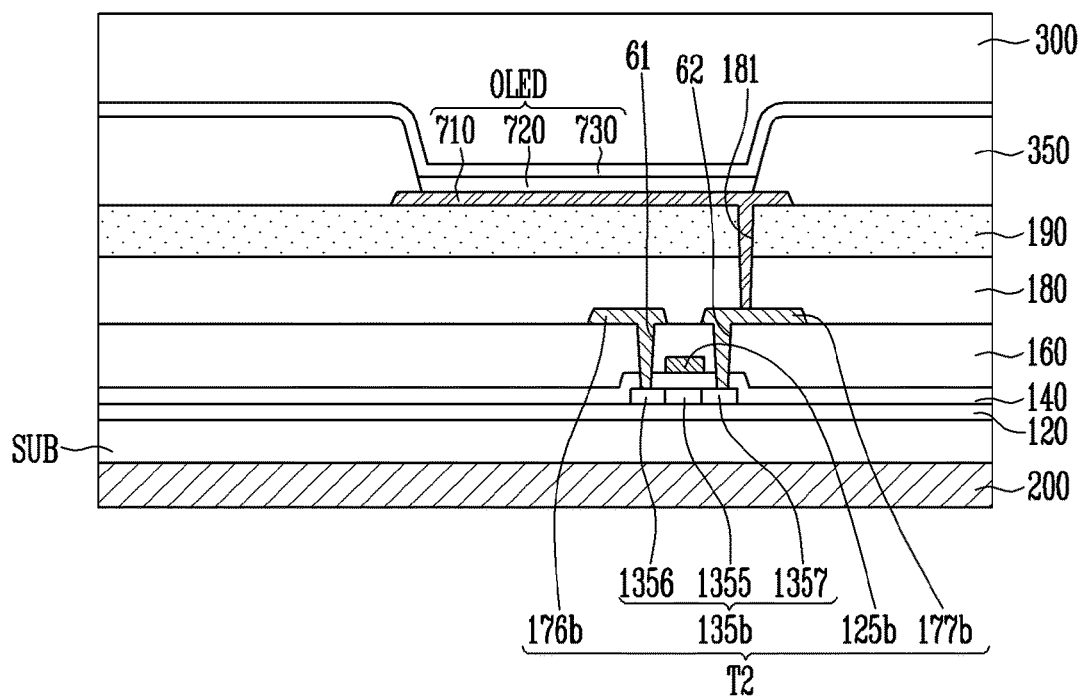

FIGS. 8A and 8B are sectional views illustrating an example of a diaphragm area DP included in the display device 1 FIG. 1.

Referring to FIGS. 1, 3A, 8A, and 8B, the diaphragm area DP of the display device 1 may include an actuator 200, a substrate SUB disposed on the actuator 200, and a backplane structure, a pixel structure, and an encapsulation layer that are successively disposed on the substrate SUB.

The actuator 200 may be disposed in the diaphragm area DP of the display device 1. In an exemplary embodiment, the actuator 200 may be formed of a plate, a voice coil, and a magnet.

The substrate SUB may be provided on the actuator 200. As described above with reference to FIG. 3A, the substrate SUB may be made of material such as polyimide, polyamide, and polyacrylates.

A buffer layer 120 including inorganic material such as silicon oxide, silicon nitride, and/or silicon oxynitride may be provided on the substrate SUB.

Although not illustrated, a barrier layer may be further included.

A first semiconductor layer 135a and a second semiconductor layer 135b may be provided on the buffer layer 120 at positions spaced apart from each other.

Each of the semiconductor layers 135a and 135b may be made of amorphous silicon, polysilicon, or an oxide semiconductor.

Each of the first and second semiconductor layer 135a and 135b may be divided into a channel area 1355 which is undoped with impurities, and a source area 1356 and a drain area 1357 which are doped with impurities. Here, the impurities may change depending on the type of a thin film transistor, and an N-type impurity or a P-type impurity may be used.

The channel area 1355 of each of the first and second semiconductor layers 135a and 135b may include undoped polysilicon, i.e., an intrinsic semiconductor.

The source area 1356 and the drain area 1357 of each of the first and second semiconductor layers 135a and 135b may include conductive-impurity-doped polysilicon, i.e., an impurity semiconductor.

A gate insulating layer 140 is formed on the first semiconductor layer 135a and the second semiconductor layer 135b. The gate insulating layer 140 may be formed of a single- or multi-layer structure including inorganic material such as silicon oxide, silicon nitride and/or silicon oxynitride.

A first gate electrode 125a, a first capacitor electrode 128, and a second gate electrode 125b may be formed on the gate insulating layer 140.

The first gate electrode 125a, the first capacitor electrode 128, and the second gate electrode 125b may be made of metal. The metal may include molybdenum (Mo), or include at least one of metals such as gold (Au), silver (Ag), aluminum (Al), chrome (Cr), titanium (Ti), nickel (Ni), neodymium (Nd), and copper (Cu), or an alloy of the metals.

Each of the first gate electrode 125a, the first capacitor electrode 128, and the second gate electrode 125b may have a single layer structure, but the inventive concepts are not limited thereto, for example, it may have a multilayer structure formed by stacking two or more materials of metals and alloys.

Each of the first and second gate electrodes 125a and 125b may overlap with the corresponding channel area 1355.

An interlayer insulating layer 160 may be disposed on the first gate electrode 125a, the first capacitor electrode 128, and the second gate electrode 125b.

The interlayer insulating layer 160 may include inorganic material such as a silicon oxide, a silicon nitride, and/or a silicon oxynitride.

A source contact hole 61 and a drain contact hole 62 may be formed in the interlayer insulating layer 160 and the gate insulating layer 140 so that the source area 1356 and the drain area 1357 are respectively exposed through the source contact hole 61 and the drain contact hole 62.

A storage contact hole 63 may be formed in the interlayer insulating layer 160 so that portion of the first capacitor electrode 128 is exposed through the storage contact hole 63.

A first source electrode 176a, a second source electrode 176b, a second capacitor electrode 178, a first drain electrode 177a, and a second drain electrode 177b may be provided on the interlayer insulating layer 160.

The electrodes (or lines) provided on the interlayer insulating layer 160 may be made of metal. For example, the electrodes (or the lines) may be made of at least one of metals such as gold (Au), silver (Ag), aluminum (Al), molybdenum (Mo), chrome (Cr), titanium (Ti), nickel (Ni), neodymium (Nd), copper (Cu), or an alloy of the metals. Each of the electrodes (or the lines) may have a single layer structure, but the inventive concepts are not limited thereto, and it may have a multilayer structure formed by stacking two or more materials of metals and alloys.

Each of the first and second source electrodes 176a and 176b may be coupled to the source area 1356 through the source contact hole 61.

Each of the first and second drain electrodes 177a and 177b may be coupled to the drain area 1357 through the drain contact hole 62.

The second capacitor electrode 178 may overlap with the first capacitor electrode 128. Hence, the first capacitor electrode 128 and the second capacitor electrode 178 may form a storage capacitor Cst with the interlayer insulating layer 160 as a dielectric.

The first semiconductor layer 135a, the first gate electrode 125a, the first source electrode 176a, and the first drain electrode 177a may form a first transistor (T1, a driving transistor).

The second semiconductor layer 135b, the second gate electrode 125b, the second source electrode 176b, and the second drain electrode 177b may form a second transistor T2.

A passivation layer 180 may be provided on the first source electrode 176a, the second source electrode 176b, the first drain electrode 177a, and the second drain electrode 177b.

The passivation layer 180 may be an inorganic insulating layer formed of inorganic material. Polysiloxane, silicon nitride, silicon oxide, silicon oxynitride, or the like may be used as the inorganic material. The passivation layer 180 may be omitted depending on embodiments.

A first protective layer 190 may be formed on the passivation layer 180.

The first protective layer 190 may be an organic insulating layer formed of organic material. Organic insulating material such as a polyacryl-based compound, a polyimide-based compound, a fluorocarbon compound such as Teflon, or a benzocyclobutene compound may be used as the organic material.

A first electrode 710 may be formed on the first protective layer 190. The first electrode 710 may include transparent conductive material or reflective metal.

The first electrode 710 may be electrically coupled to the second drain electrode 177b of the second transistor T2 through a contact hole 181 formed in the passivation layer 180 and the first protective layer 190, and may be an anode electrode of the organic light emitting diode OLED.

A pixel definition layer 350 may be formed on the first protective layer 190 and portion of the first electrode 710. The pixel definition layer 350 is an organic insulating layer made of organic material. The pixel definition layer 350 may include an opening through which the first electrode 710 is exposed. The pixel definition layer 350 may define an emission area corresponding to each pixel (or sub-pixel). A surface of the first electrode 710 that is exposed from the pixel definition layer 350 may be defined as an emission area.

An organic emission layer 720 may be provided in the opening of the pixel definition layer 350. The organic emission layer 720 may include low-molecular or high-molecular material. The organic emission layer 720 may include a red organic emission layer configured to emit red light, a green organic emission layer configured to emit green light, and a blue organic emission layer configured to emit blue light. The red organic emission layer, the green organic emission layer, and the blue organic emission layer may be respectively formed in a red sub-pixel, a green sub-pixel, and a blue sub-pixel.

Alternatively, white organic emission layers configured to emit white light may be respectively formed in the red sub-pixel, the green sub-pixel, and the blue sub-pixel, and a red color filter, a green color filter, and a blue color filter may be formed in the respective pixels to embody a color image.

A second electrode 730 may be provided on the pixel definition layer 350 and the organic emission layer 720. The second electrode 730 may be formed of a metal layer and/or a transparent conductive layer. In an exemplary embodiment, the second electrode 730 may be formed of a multi-layer structure having two or more layers including a thin metal layer. For example, the second electrode 730 may be formed of a triple-layer structure of ITO/Ag/ITO.

As the first electrode 710 is the anode electrode of the organic light emitting diode OLED, the second electrode 730 may be a cathode electrode of the organic light emitting diode OLED. In some cases, the first electrode 710 may be the cathode electrode, and the second electrode 730 may be the anode electrode.

The first electrode 710, the organic emission layer 720, and the second electrode 730 may form the organic light emitting diode OLED.

A thin film encapsulation layer 300 may be provided on the second electrode 730. The thin film encapsulation layer 300 may prevent oxygen or water from permeating the organic light emitting diode OLED. The thin film encapsulation layer 300 may include a plurality of inorganic layers (not shown) and/or a plurality of organic layers (not shown).

Figure 9:
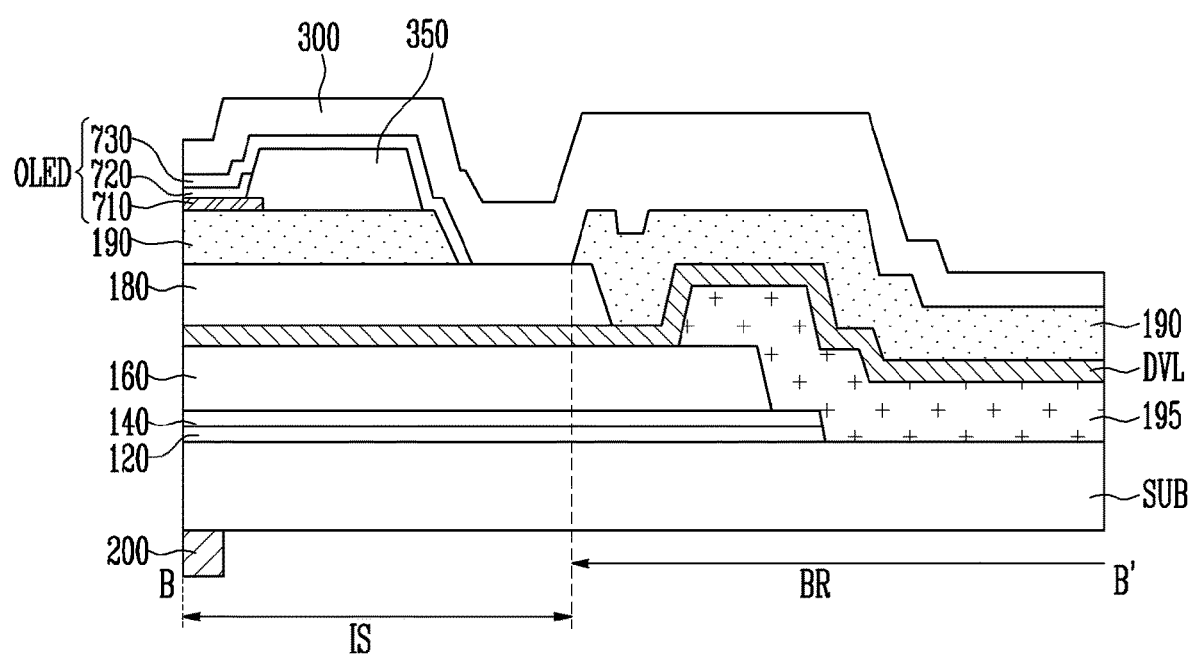
FIG. 9 is a sectional view taken along line B-B' of the display device of FIG. 3A.

FIG. 9 is a sectional view taken along line B-B' of the display device of FIG. 3A.

Referring to FIGS. 3A and 9, lines for supplying power (e.g., a voltage of a first power supply ELVDD or a second power supply ELVSS), a data signal, a scan signal, etc. to a pixel structure formed in the island IS may be formed in the bridge BR.

Referring to FIG. 9, a second protective layer 195 may be provided on portion of the substrate SUB that corresponds to the bridge BR. An actuator 200 may be disposed under at least portion of the substrate SUB that corresponds to the island IS.

The buffer layer 120, the gate insulating layer 140, and the interlayer insulating layer 160 may include an opening through which the bridge BR of the substrate SUB is exposed.

In other words, the buffer layer 120, the gate insulating layer 140, and the interlayer insulating layer 160 may not be provided in most of the area of the bridge BR.

The second protective layer 195 may formed to cover edges of the buffer layer 120, the gate insulating layer 140, and the interlayer insulating layer 160, and the portion of the bridge BR that is exposed through the opening.

The second protective layer 195 may be an organic insulating layer formed of organic material.

A line DVL may be formed on the second protective layer 195. Although FIG. 9 illustrates the single line DVL, a plurality of lines may be provided parallel to each other on the bridge BR in a plan view.

The line DVL provided on the bridge BR may extend along the shape of the bridge BR. The line DVL provided on the bridge BR may extend to the island IS. The line DVL that extends to the island IS may be disposed on the interlayer insulating layer 160 and electrically coupled to the transistors T1 and T2, the storage capacitor Cst, and the organic light emitting diode OLED.

For example, the line DLV that extends from the bridge BR to the island IS may be coupled to some of electrodes/lines disposed on the interlayer insulating layer 160, and may be electrically coupled to some of electrodes/lines disposed on the gate insulating layer 140.

The line DVL may be formed of the same material as that of the source electrode 176a or 176b of the transistor, the second capacitor electrode 178, and the drain electrode 177a or 177b of the transistor that are provided on the interlayer insulating layer 160.

The first protective layer 190 may be formed on the line DVL. The first protective layer 190 that is provided on the bridge BR may be formed to cover an edge of the passivation layer 180.

In other words, portion of the line DVL may be protected by the first protective layer 190, and the other portion of the line DVL may be protected by the passivation layer 180.

In the display device according to an exemplary embodiment of the inventive concepts, inorganic insulating layers such as the buffer layer 120, the gate insulating layer 140, the interlayer insulating layer 160, and the passivation layer 180 may be mainly provided in the island IS of the substrate SUB which seldom receives stress even when the substrate SUB stretches. The amount of the inorganic insulating layers that are provided in the bridge BR which easily receives stress may be minimized. Thereby, mot of the line DVL may be disposed on an organic insulating layer in the bridge BR.

Since the hardness of organic insulating layers is lower than that of inorganic insulating layers, the organic insulating layer may absorb tensile stress applied to the substrate SUB and effectively minimize concentration of tensile stress on the line DVL.

The actuator 200 may be disposed under portion of the island IS of the substrate SUB. The actuator 200 may be formed of a vibrator configured to vibrate the display panel 100 including the substrate SUB. Thereby, the island IS that overlaps with the actuator 200 may vertically vibrate, and the bridge BR coupled to the island IS may vertically stretch. Due to the direction in which the bridge BR stretches, the diaphragm area including the island IS may be prevented from horizontally wobbling.

Figure 10A:
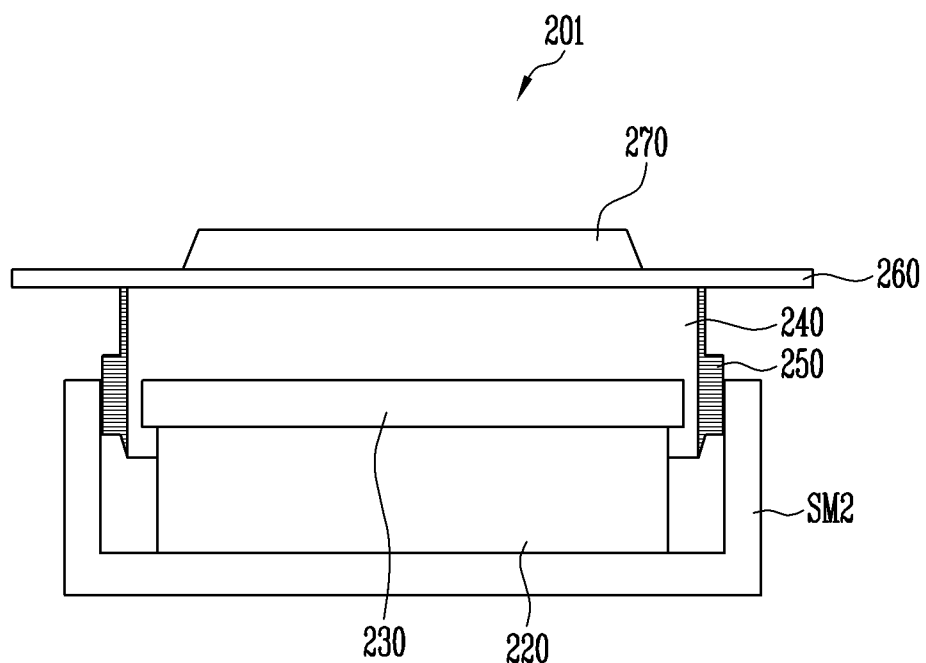
FIGS. 10A and 10B are diagrams illustrating examples of an actuator included in the display device of FIG. 1.
Figure 10B:
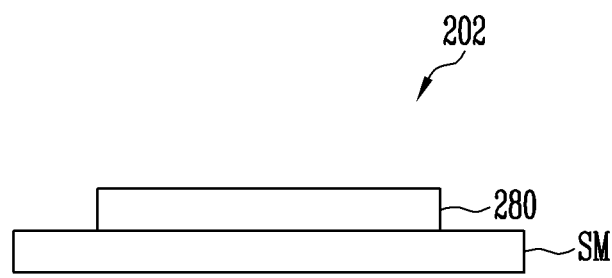

FIGS. 10A and 10B are diagrams illustrating examples of the actuator 200 included in the display device 1 of FIG. 1.

Referring to FIGS. 1, 10A, and 10B, an actuator 201, 202 may include a configuration for vertically vibrating the display panel 100.

In an exemplary embodiment, as illustrated in FIG. 10A, the actuator 201 may include a vibrator for embodying a dynamic speaker. The actuator 201 may be disposed on the support member SM2. The support member SM2 may house the actuator 201.

The actuator 201 may include a magnet 220 provided in the support member SM2, a plate 230 attached to an upper surface of the magnet 220, a bobbin 240 provided around the magnet 220, a voice coil 250 wound around the bobbin 240, an upper surface adhesion member 270 attached to an upper surface of the voice coil 250, and a damper 260 disposed under the upper surface adhesion member 270.

The voice coil 250 may be an electromagnet which is supplied with power, and may generate vertical vibrating force (up and down vibrating force) using interaction with the magnet 220. Due to the vertical vibrating force, a diaphragm area of the substrate or the display panel that is disposed on the upper surface adhesion member 270 may vertically vibrate. Hence, sound may be output out of the display device.

In an exemplary embodiment, as illustrated in FIG. 10B, the actuator 202 may include a configuration for vibrating a diaphragm area of the display panel 100 using inverse piezoelectric effect.

The actuator 202 may include a piezoelectric element 280 disposed on a support member. The piezoelectric element 280 may include ceramic material having piezoelectric characteristics. The piezoelectric element 280 may vibrate by a voltage applied thereto, thus vibrating the diaphragm area of the display panel 100. The actuator 202 including the piezoelectric element 280 may be thin and light and have high energy efficiency, compared to those of the actuator 201 having a dynamic speaker structure.

However, this is only exemplary, and the configuration of the actuator 202 is not limited thereto. For example, the actuator 202 may include a configuration of an electrostatic speaker or an ionic speaker.

Figure 11A:
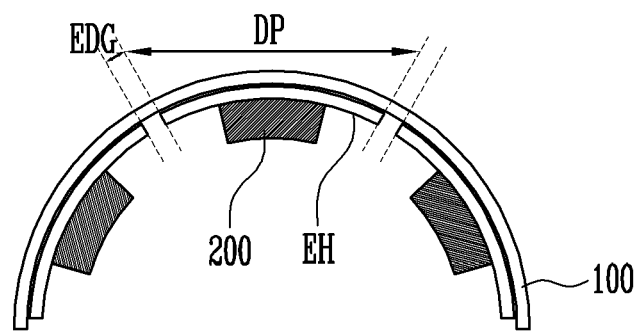
FIG. 11A is a view schematically illustrating an example of a horizontal cross-section of the display device of FIG. 1.
Figure 11B:
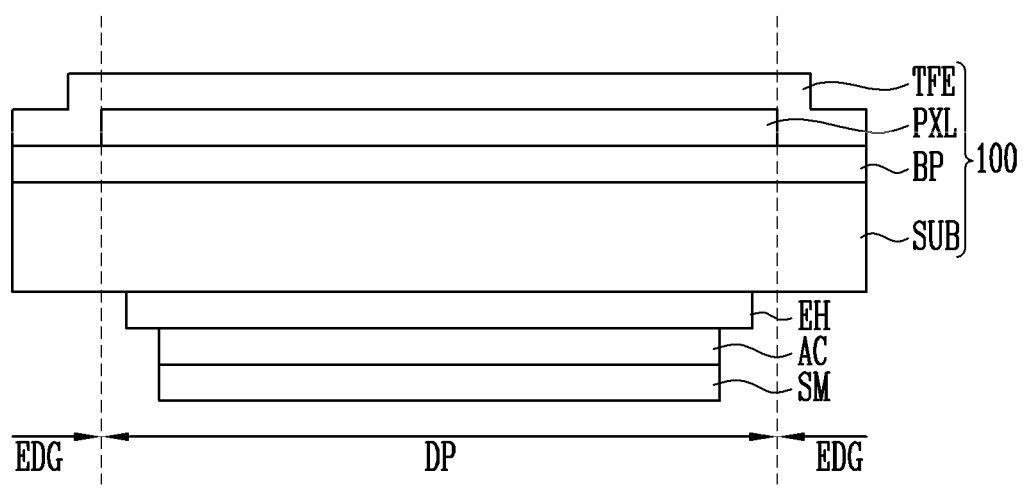
FIG. 11B is a sectional view schematically illustrating an example of portion of the display device of FIG. 1.

FIG. 11A is a view schematically illustrating an example of a horizontal cross-section of the display device 1 of FIG. 1. FIG. 11B is a sectional view schematically illustrating an example of portion of the display device 1 of FIG. 1.

In FIGS. 11 and 11B, like reference numerals will be used to designate the same components as those described with reference to FIGS. 2B and 7A, and repetitive explanation of the components will be omitted. Furthermore, the display device of FIGS. 11A and 11B, other than the configuration of a reinforcing member EH, may have a configuration identical or similar to the display device of FIGS. 2B and 7A.

Referring to FIGS. 2B, 7A, 11A, and 11B, the display device in accordance with an exemplary embodiment may include a display panel 100, an actuator 200, an reinforcing member EH, and a support member SM.

The display panel 100 may include a rigid diaphragm area DP and a stretchable speaker edge area EDG.

The actuator 200 may overlap with the diaphragm area DP of the display panel 100 and be disposed on an inner surface of the display panel 100.

The reinforcing member EH may be disposed between the actuator 200 and an island of the substrate SUB that corresponds to the diaphragm area DP. The reinforcing member EH may function to enable the diaphragm area DP of the display panel 100 to more accurately response to vibration of the actuator 200.

In an exemplary embodiment, the reinforcing member EH may be made of high-density material such as metal or glass. The high-density material may more accurately transmit vibration to the substrate SUB including a high-molecular compound.

Therefore, the quality of the output of sound from the diaphragm area DP may be enhanced by the reinforcing member EH.

Figure 12:
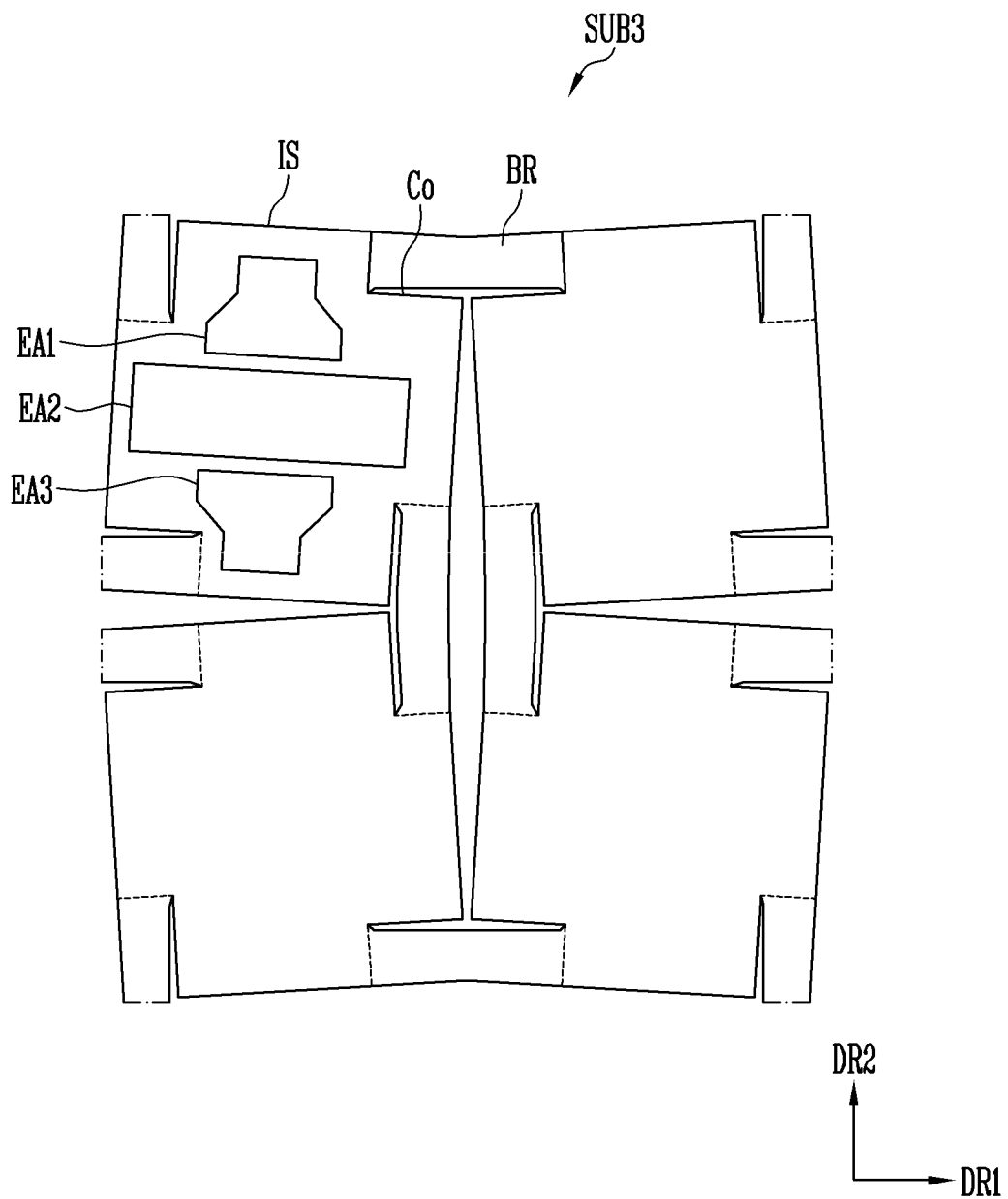
FIG. 12 is a diagram illustrating an example of portion of a substrate included in a display panel of the display device of FIG. 1.

FIG. 12 is a diagram illustrating an example of portion of a substrate included in the display panel 100 of the display device 1 of FIG. 1.

Referring to FIG. 12, a substrate SUB3 is stretchable, and may stretch or shrink in an direction.

The substrate SUB3 of FIG. 12, other than shapes and connection relationship of an island IS and a bridge BR, may have a configuration identical or similar to the substrate of FIG. 3A or the like.

The substrate SUB3 may include islands IS and bridges BR which are separated from each other by cut portions Co. The cut portions Co may be openings formed by removing portions of the substrate SUB. In detail, portion of the substrate SUB, e.g., the speaker edge area (EDG of FIG. 3A) or the stretchable area (STA of FIG. 3A), may have a shape in which the islands IS and the bridges BR that are coupled to edges of the islands IS are arranged in a first direction DR1 and a second direction DR2.

A pixel structure (e.g., a thin film transistor, a capacitor, and an organic light emitting diode) may be formed on each island IS. A single pixel may be formed on each island IS, or a plurality of pixels may be formed thereon. For example, a first emission area EA1, a second emission area EA2, and a third emission area EA3 that are included in a single pixel may be provided in each island IS. The first to third emission areas EA1, EA2, and EA3 may respectively correspond to first to third sub-pixels.

Each bridge may be provided with lines for supplying a supply voltage, a data signal, a scan signal, and so forth to the corresponding pixel structure.

Figure 13:
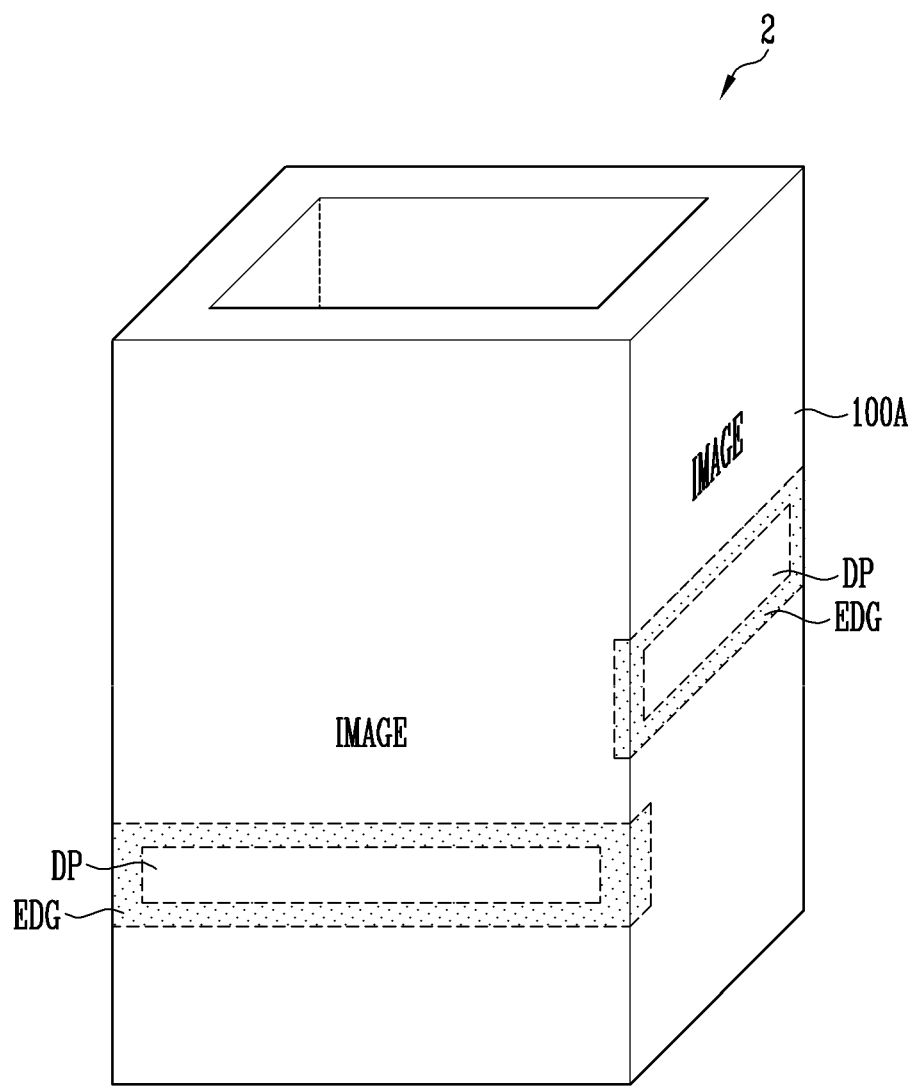
FIG. 13 is a diagram illustrating a display device in accordance with exemplary embodiments of the inventive concepts.
Figure 14A:
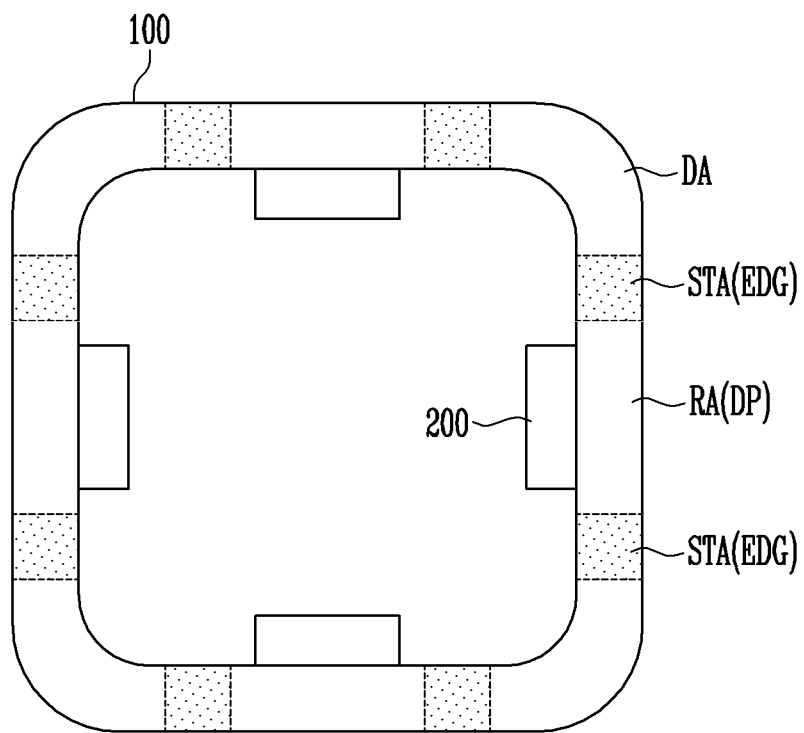
FIGS. 14A, 14B, and 14C are diagrams schematically illustrating examples of a horizontal cross-section of the display device of FIG. 13.
Figure 14B:
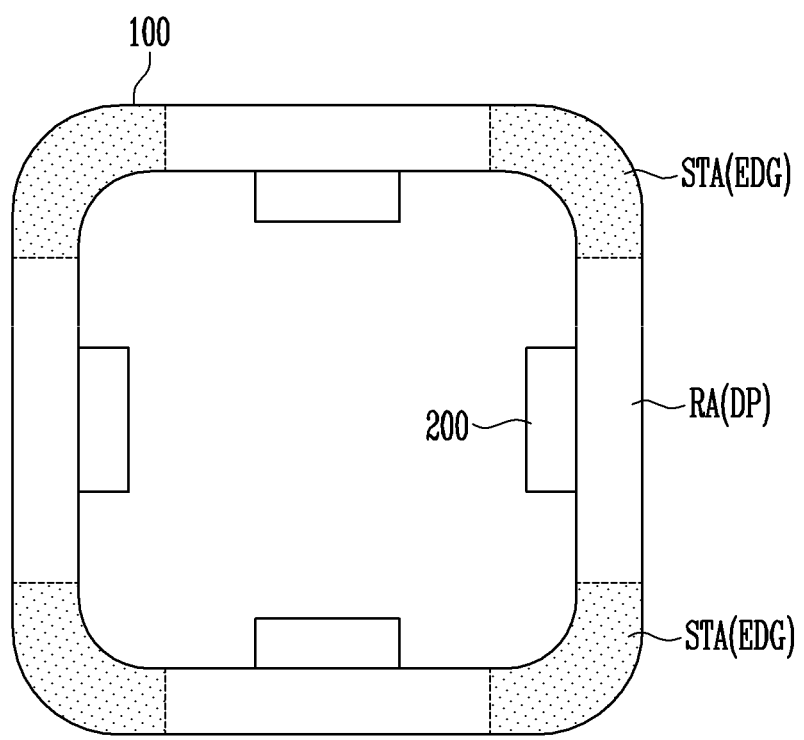
Figure 14C:
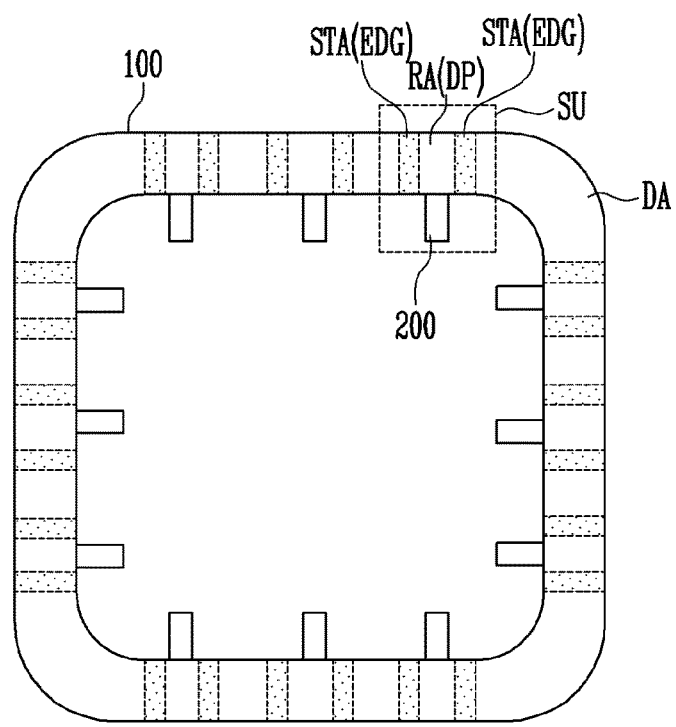

FIG. 13 is a diagram illustrating a display device 2 in accordance with exemplary embodiments of the inventive concepts. FIGS. 14A to 14C are diagrams schematically illustrating examples of a horizontal cross-section of the display device of FIG. 13.

In FIGS. 13 to 14C, like reference numerals will be used to designate the same components as those described with reference to FIGS. 1 to 3B, and repetitive explanation of the components will be omitted. The display device 2 of FIGS. 13 to 14C, other than the shape thereof, may have a configuration identical or similar to the substrate SUB and the display device of FIG. 3A.

Referring to FIGS. 13 to 14C, the display device 2 may include a display panel 100A or 100 and a plurality of actuators 200.

In an exemplary embodiment, an outer surface of the display panel 100 may be an emission surface. Sound may be output through portion of the outer surface of the display panel 100. For example, sound may be output from diaphragm areas DP of the display panel 100 that overlap with the actuators 200. A plan shape of the outer surface may be a square shape, or a square shape with at least one curved corner.

An inner surface of the display panel 100 may define an empty space. For example, a plan shape of the inner surface may be a square shape, or a square shape with at least one curved corner.

In an exemplary embodiment, the display panel 100 may include a speaker edge area EDG which encloses the rigid diaphragm area DP. The speaker edge area EDG may be a stretchable area STA. The speaker edge area EDG may include a plurality of bridges, or may include a plurality of bridges, and islands coupled to the bridges.

In the case where the speaker edge area EDG includes only the bridges, an image may not be displayed on the speaker edge area EDG. In the case where the speaker edge area EDG includes the bridges and the islands coupled to the bridges, an image may be displayed on the speaker edge area EDG.

In an exemplary embodiment, as illustrated in FIG. 14A, the speaker edge area EDG may be formed in a planar area of the display panel 100. In an exemplary embodiment, as illustrated in FIG. 14B, the speaker edge area EDG may be formed in a curved area of the display panel 100. In an exemplary embodiment, as illustrated in FIG. 14C, the display device may include an array of a plurality of speaker units SU each of which includes an actuator 200, a diaphragm area DP, and a speaker edge area EDG.

Figure 15:
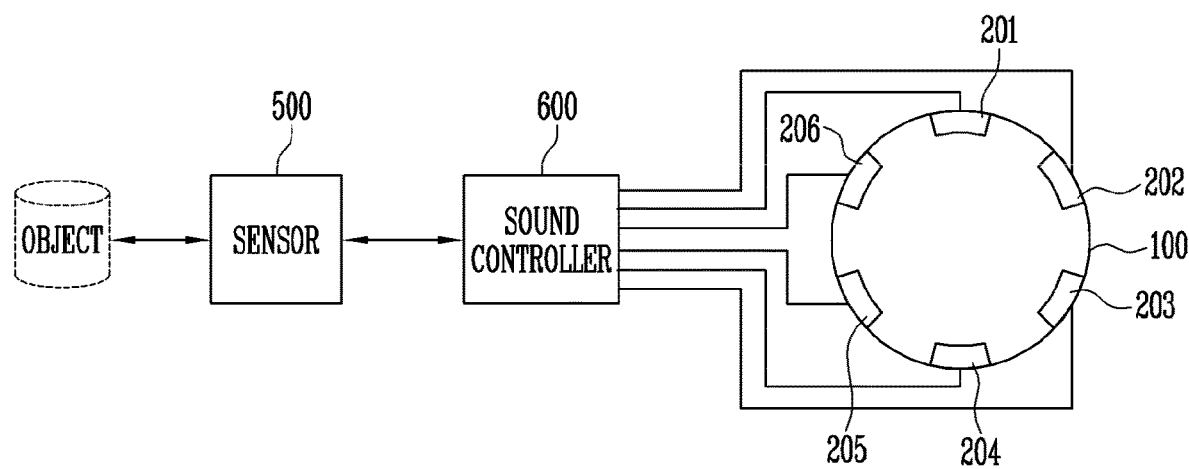
FIG. 15 is a diagram illustrating an example of a display device in accordance with various exemplary embodiments of the inventive concepts.
Figure 16:
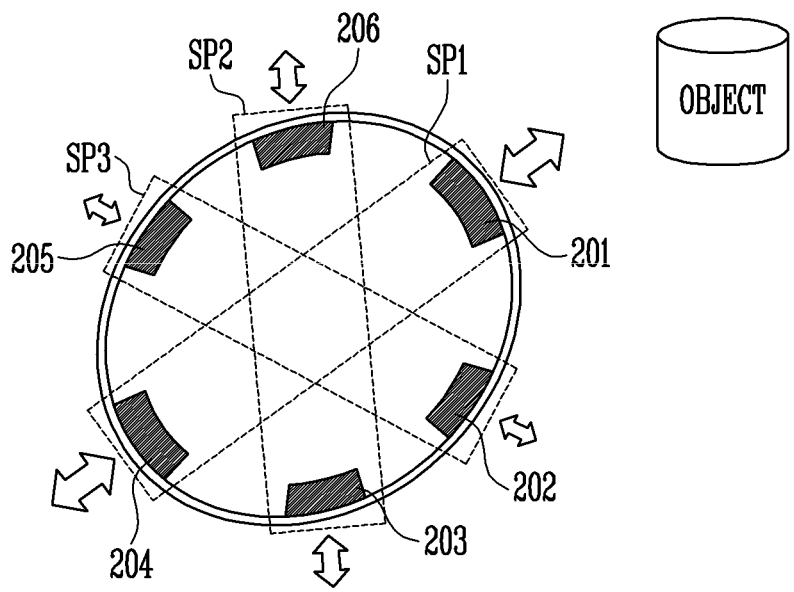
FIG. 16 is a diagram illustrating an example of an operation of the display device of FIG. 15.
Figure 17:
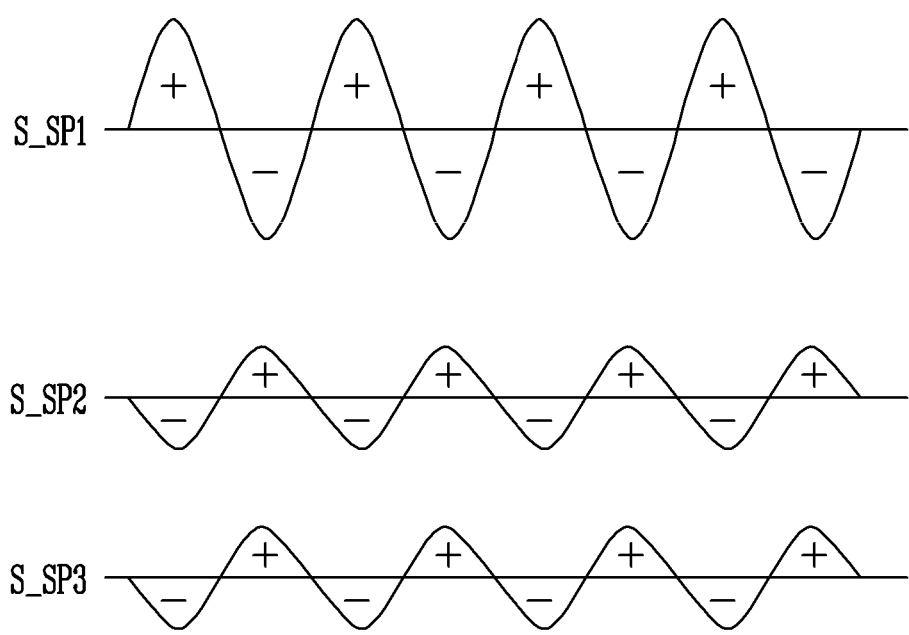
FIG. 17 is a waveform diagram illustrating examples of sound signals to be input to speakers included in the display device of FIG. 16.

FIG. 15 is a diagram illustrating an example of a display device 1 in accordance with various exemplary embodiments of the inventive concepts. FIG. 16 is a diagram illustrating an example of an operation of the display device 1 of FIG. 15. FIG. 17 is a waveform diagram illustrating examples of sound signals to be input to speakers included in the display device 1 of FIG. 16.

Referring to FIGS. 1 and 15 to 17, the display device 1 may include a display panel 100, a plurality of actuators 201 to 206, a sensor 500, and a sound controller 600.

The sensor 500 may sense the location of an object. For example, the sensor 500 may include a direction sensor, a distance sensor, etc., and determine the distance between the object and the display device 1. Furthermore, the sensor 500 may detect a speaker unit that is closest to the object. Here, the speaker unit may refer to an actuator and a diaphragm area of the display panel that corresponds to the actuator. The object may be at least one user.

The sound controller 600 may differently control intensities of sound output from the diaphragm areas, based on the location of the object that is received from the sensor 500. In other words, the sound controller 600 may control the intensity and phase of a sound signal to be supplied to each of the actuators 201 to 206, based on the location of the object.

In an exemplary embodiment, the sound controller 600 may control sound signals for respective actuator pairs SP1, SP2, and SP3. As illustrated in FIG. 16, each of the actuator pairs SP1, SP2, and SP3 may be a pair of actuators that are disposed farthest from each other in a plan view. For example, first and fourth actuators 201 and 204 may be set to a first actuator pair SP1, second and fifth actuators 202 and 205 may be set to a second actuator pair SP2, and third and sixth actuators 203 and 206 may be set to a third actuator pair SP3.

The sound controller 600 may control sound signals to be provided to the actuators such that the intensity of a sound signal to be provided to at least one actuator pair that is closest to the location of the object is greater than a sound signal to be provided to the other actuators. Furthermore, the sound controller 600 may control the sound signals to be provided to the actuators such that the phase of a sound signal to be provided to at least one actuator pair that is closest to the location of the object is opposite to that of sound signals to be provided to the other actuators.

For example, as illustrated in FIGS. 16 and 17, in the case where the first actuator 201 is closest to the object, the intensity of a first sound signal S_SP1 to be provided to the first actuator pair SP1 may be greater than that of second and third sound signals S_SP2 and S_SP3 to be respectively provided to the second and third actuator pairs SP2 and SP3. Furthermore, in the case where the first actuator 201 is closest to the object, the first sound signal S_SP1 may have a phase opposite to that of the second and third sound signals S_SP2 and S_SP3.

Hence, when sound is output, the sound level of the speaker unit corresponding to the first actuator pair SP1 may be greater than that of the other speaker units. In other words, the amplitude of vibration of the diaphragm areas corresponding to the first actuator pair SP1 may be largest. Thus, when sound is output, a stretch range of first speaker edge areas corresponding to the first actuator pair SP1 may be greater than stretch ranges of the other speaker edge areas corresponding to the other actuator pairs SP2 and SP3.

Furthermore, since the phase of the first sound signal S_SP1 is opposite to that of the second and third sound signals S_SP2 and S_SP3, periods of vibration of the diaphragms are different from each other. In other words, when the diaphragm areas corresponding to the first actuator pair SP1 move outward from the display device, the diaphragm areas corresponding to the other actuator pairs SP2 and SP3 may move inward from the display device. That is, when sound is output, the curvature of the diaphragm areas corresponding to the first actuator pair SP1 may increase, so that the display device may form an elliptical plan shape.

Consequently, the output sound may be focused toward the user, whereby the user may experience more realistic sound effects.

As described above, in a display device in accordance with various exemplary embodiments of the inventive concepts, a display area of a display panel may not only display an image but also function as a speaker. Furthermore, since the display device includes a rigid diaphragm area and a stretchable speaker edge area that encloses the diaphragm area, the sound output quality of the display panel itself may be markedly improved.

In addition, the sound output holes that have been formed in the outer surface of the conventional display panel may be removed. Therefore, the cost required to couple a separate speaker component to the display device may be reduced. Since the sound output holes are removed from the display area, the display quality may also be enhanced, and the aesthetic effect of the display device may be improved.

Some of the advantages that may be achieved by exemplary embodiments of the invention include having a display area of a display panel that may not only display an image but also function as a speaker. Furthermore, since the display device includes a rigid diaphragm area and a stretchable speaker edge area that encloses the diaphragm area, the sound output quality of the display panel itself may be markedly improved. In addition, the sound output holes that have been formed in the conventional display panel may be removed. Therefore, the cost required to couple a separate speaker component to the display device may be reduced. Since the sound output holes are removed from the display area, the display quality may also be enhanced, and the aesthetic effect of the display device may be improved.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel comprising a substrate including a plurality of islands that are rigid and a plurality of bridges that are stretchable coupling the islands to each other; and
a plurality of actuators provided on first surfaces of at least one of the islands of the substrate,
wherein the actuators are configured to vibrate a first area of the display panel that includes portions overlapping with the respective actuators.

2. The display device of claim 1, wherein an outer surface of the display panel comprises an emission surface, and an inner surface of the display panel defines an empty space.

3. The display device of claim 2, wherein an image and sound are output outward from the display panel that overlaps with the actuators.

4. The display device of claim 1, wherein the display panel further comprises:
a plurality of pixels provided on a second surface of each of the islands that is opposite to the first surface; and
lines provided on the plurality of respective bridges and coupled with the respective pixels.

5. The display device of claim 4, further comprising:
a plurality of reinforcing members provided to overlap with the respective actuators, and disposed between the respective actuators and the corresponding islands.

6. The display device of claim 5, wherein the reinforcing members include at least one of metal and glass.

7. The display device of claim 4, further comprising:
a support member disposed on a surface of each of the actuators that is opposite to a surface of the actuator that comes into contact with the corresponding island, the support member being configured to support the corresponding actuator.

8. The display device of claim 1, wherein the actuators are disposed in one-to-one correspondence with the first surfaces of the respective islands.

9. The display device of claim 8, wherein the bridges stretch such that the first area of the display panel vibrates in a vertical direction with respect to the actuators, and function as a speaker edge.

10. The display device of claim 1, wherein the islands comprise:
a plurality of first islands on which the respective actuators are disposed; and
a plurality of second islands disposed between the first islands and provided with no actuator.

11. The display device of claim 10, wherein the second islands and the bridges form a stretchable area.

12. The display device of claim 11, wherein an area of each of the first islands is greater than an area of each of the second islands.

13. The display device of claim 10, further comprising:
a plurality of reinforcing members provided to overlap with the respective actuators, and disposed between the respective actuators and the corresponding first islands.

* * * * *